United States Patent
Liu et al.

(10) Patent No.: US 7,427,893 B2
(45) Date of Patent: Sep. 23, 2008

(54) CIRCUIT AND METHOD FOR CONTROLLING THE POWER MODE A CLASS-D AMPLIFIER

(75) Inventors: Kwang-Hwa Liu, 714 Jura Wan, Sunnyvale, CA (US) 94087; Kuo-Hung Wu, Tainan County (TW)

(73) Assignee: Kwang-Hwa Liu CA (US)

( * ) Notice: Subject to any disclaimer, the term of this patent is extended or adjusted under 35 U.S.C. 154(b) by 138 days.

(21) Appl. No.: 11/309,061

(22) Filed: Jun. 15, 2006

(65) Prior Publication Data

US 2007/0290743 A1  Dec. 20, 2007

(51) Int. Cl.
*H03F 1/14* (2006.01)
*H03F 3/217* (2006.01)

(52) U.S. Cl. .................. 330/51; 330/251; 330/207 A
(58) Field of Classification Search ............... None
See application file for complete search history.

(56) References Cited

U.S. PATENT DOCUMENTS

| | | | | |
|---|---|---|---|---|
| 5,398,003 | A | | 3/1995 | Heyl et al. ............... 330/10 |
| 5,805,020 | A | * | 9/1998 | Danz et al. ............... 330/10 |
| 5,898,340 | A | * | 4/1999 | Chatterjee et al. ......... 330/251 |
| 6,636,113 | B1 | * | 10/2003 | Kirn ................... 330/10 |
| 6,806,766 | B2 | * | 10/2004 | Hasegawa ............... 330/9 |
| 7,274,254 | B2 | * | 9/2007 | Hsieh ................... 330/51 |
| 2002/0167354 | A1 | | 11/2002 | Stanley ................. 330/10 |
| 2007/0018719 | A1 | * | 1/2007 | Seven ................... 330/51 |

* cited by examiner

*Primary Examiner*—Robert J. Pascal
*Assistant Examiner*—Alan Wong
(74) *Attorney, Agent, or Firm*—Jianq Chyun IP Office

(57) ABSTRACT

A circuit and a method for controlling the power mode of a class-D amplifier are provided. The power mode control circuit comprises an amplitude detector and a duration detector. The amplitude detector provides an amplitude signal according to the absolute signal level of an input signal. The duration detector provides a shut-down signal to a switching control circuit of a class-D amplifier according to the length of the time period in which the amplitude signal is at a predetermined state, wherein the switching control circuit is turned on or turned off in response to the shut-down signal.

16 Claims, 3 Drawing Sheets

CIRCUIT AND METHOD FOR CONTROLLING THE POWER MODE A CLASS-D AMPLIFIER

BACKGROUND OF THE INVENTION

1. Field of the Invention

The present invention relates to class-D amplifiers. More particularly, the present invention relates to an improvement of class-D amplifiers.

2. Description of the Related Art

Portable electronic devices such as wireless phones or portable music players run on rechargeable batteries. The audio amplifier for driving the speaker or earphone is a major power consuming component in such a portable device. For extended battery lifetime, class-D amplifiers are usually adopted because a class-D amplifier is more efficient than a class-AB amplifier under general circumstances.

FIG. 1 is a schematic diagram showing the circuit of a conventional class-D amplifier 100. Since class-D amplifiers are already well known, it is unnecessary to discuss their operation details here. Briefly speaking, comparator 106 compares the amplified input signal provided by amplifier 104 and the triangle signal provided by ramp generator 118. Pulse width modulation (PWM) logic 108 drives the output stage consisting of metal oxide semiconductor field effect transistors (MOSFETs) Q1-Q4 through gate drivers 110 according to the output signal of comparator 106.

Please refer to FIG. 2. FIG. 2 is a schematic diagram showing voltage waveforms of class-D amplifier 100. Signal 201 is the amplified input signal provided by amplifier 104. Signal 202 is the triangle signal provided by ramp generator 118. Comparator 106 compares signals 201 and 202. Signal 203 is the voltage signal output by MOSFETs Q1-Q4 and received by low-pass filter 116. MOSFETs Q1-Q4 are operated as switches. As shown in FIG. 2, signal 203 is a square wave at a high state when amplified input signal 201 is higher than triangle wave 202 and at a low state when amplified input signal 201 is lower than triangle wave 202. Low-pass filter 116 passes the average value of square wave 203 to loudspeaker 114. Thus loudspeaker 114 is driven by an amplified signal whose waveform approximates the original input signal Vin.

In typical voice communication or music playback, the audio signal generally has frequent pauses for milliseconds or even a fraction of a second. During a wireless phone conversation, typically only one party is in a talking mode, the other party is in a listening mode. The audio amplifier for the talking party is often inactive but still consumes power. Furthermore, when the input signal is below the audible level, a class-D amplifier may actually have a poorer efficiency than that of a class-AB amplifier. This is due to gate charge loss and switching loss. For low power applications such as in cellular phones or portable music players, the gate charge loss and switching loss of a class-D power amplifier are relatively significant.

SUMMARY OF THE INVENTION

Accordingly, the present invention is directed to a circuit and a method for controlling the power mode of a class-D amplifier. The purpose of the present invention is automatically turning off power consuming circuit sections of a class-D amplifier after the input audio signal is below the audible level for a certain period of time, thereby reducing power consumption, improving efficiency of the class-D audio amplifier, and extending battery run time.

According to an embodiment of the present invention, a power mode control circuit for a class-D amplifier is provided. The power mode control circuit comprises an amplitude detector and a duration detector. The amplitude detector provides an amplitude signal according to the absolute signal level of an input signal. The duration detector provides a shut-down signal to a switching control circuit of a class-D amplifier according to the length of the time period in which the amplitude signal is at a predetermined state, wherein the switching control circuit is turned on or turned off in response to the shut-down signal.

In this embodiment, the amplitude signal is at a high state when the absolute signal level of the input signal is greater than a first reference voltage and is at a low state when the absolute signal level is smaller than the first reference voltage. The shut-down signal is at the high state when the amplitude signal is at the low state for more than a predetermined time period, otherwise the shut-down signal is at the low state. The switching control circuit is turned off when the shut-down signal is at the high state and is turned on when the shut-down signal is at the low state.

In this embodiment, the duration detector comprises a controlled ramp circuit and a shut-down circuit. The controlled ramp circuit outputs the voltage level of a ground when the amplitude signal is at the high state and outputs a ramp signal transitioning from the voltage level of the ground to the voltage level of a voltage source when the amplitude signal is at the low state. The shut-down circuit outputs the shut-down signal according to the output of the controlled ramp circuit.

In this embodiment, the controlled ramp circuit comprises a current source, a capacitor and a switch. The current source is coupled between the voltage source and the shut-down circuit. The capacitor is coupled between the shut-down circuit and the ground. The switch is coupled in parallel with the capacitor and is turned on or turned off in response to the amplitude signal.

In this embodiment, the shut-down circuit is a comparator providing the shut-down signal according to the comparison result of a second reference voltage and the output of the controlled ramp circuit. When the switch is turned off, it takes about the predetermined time period for the voltage across the capacitor to charge from about 0V to about the second reference voltage.

According to another embodiment of the present invention, a power mode control method for a class-D amplifier is provided. The method comprises the steps of providing an amplitude signal according to the absolute signal level of an input signal and providing a shut-down signal to the switching control circuit of a class-D amplifier according to the length of the time period in which the amplitude signal is at a predetermined state. The switching control circuit is turned on or turned off in response to the shut-down signal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
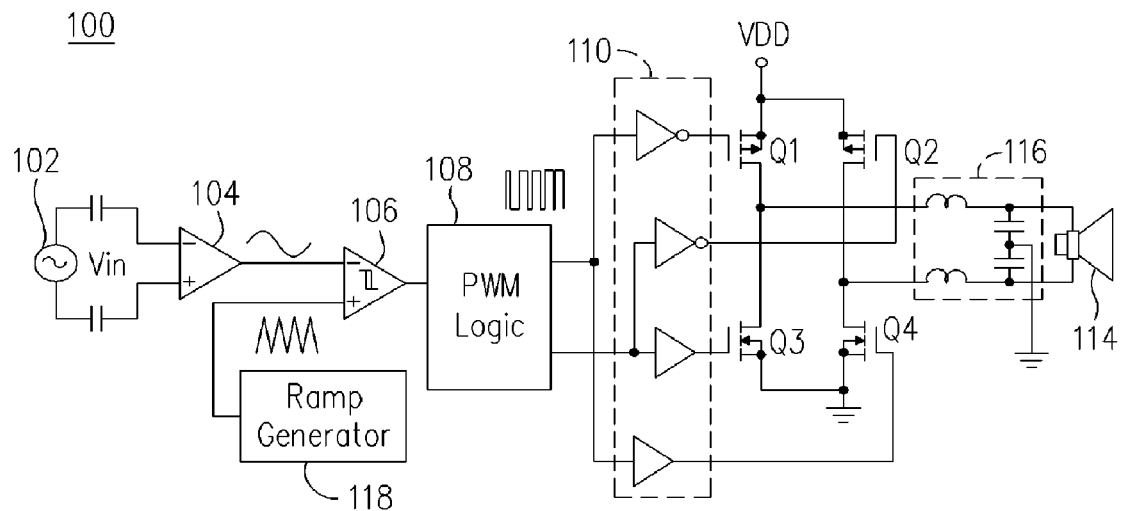
FIG. 1 is a schematic diagram showing the circuit of a conventional class-D amplifier.
Figure 2:
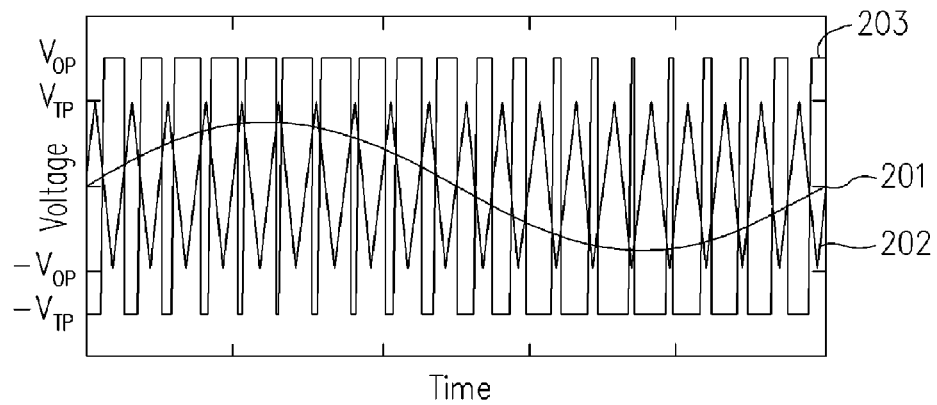
FIG. 2 is a schematic diagram showing voltage waveforms of the class-D amplifier in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
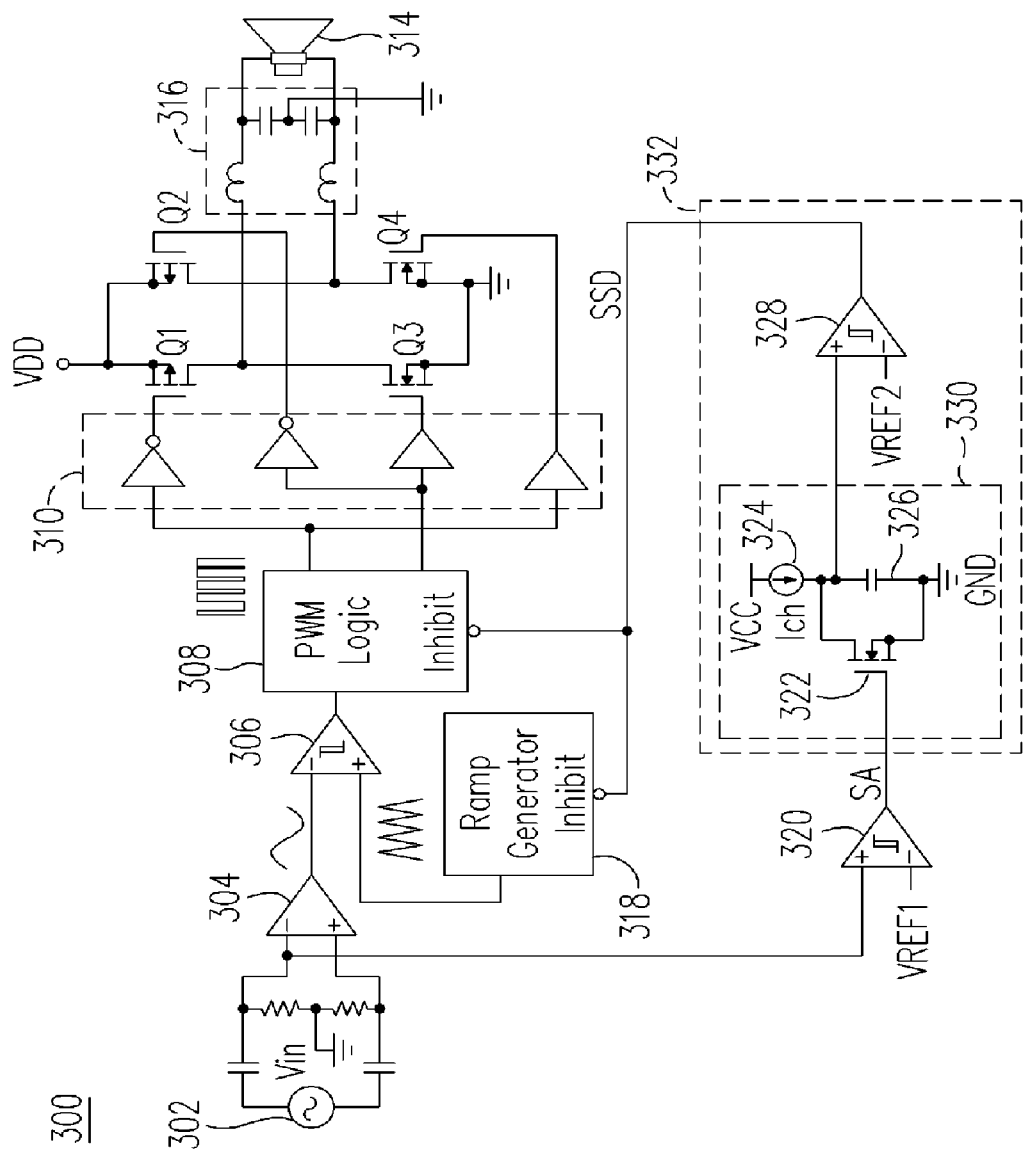
FIG. 3 is a schematic diagram showing the circuit of a class-D amplifier with the power mode control circuit according to an embodiment of the present invention.

FIG. 3 is a schematic diagram showing the circuit of a class-D amplifier 300 with the power mode control circuit according to an embodiment of the present invention. A major difference between class-D amplifier 300 in FIG. 3 and class-D amplifier 100 in FIG. 1 is the power mode control circuit consisting of amplitude detector 320 and duration detector 332.

Class-D amplifier 300 has two power modes, namely, the operating mode and the power-saving mode. In the operating mode, class-D amplifier 300 works in the same way as the conventional class-D amplifier 100 in FIG. 1. However, when input signal Vin for class-D amplifier 300 is lower than the audible level (50 mV in this embodiment) for more than a predetermined time period (2 milliseconds in this embodiment), the power mode control circuit switches class-D amplifier 300 from the operating mode into the power-saving mode by turning off the switching control circuit of class-D amplifier 300. The switching control circuit is a section of a class-D amplifier which drives the power MOSFETs of the class-D amplifier according to the input signal. In this embodiment, the switching control circuit includes gate drives 310, PWM logic 308 and ramp generator 318. When the switching control circuit is turned off, power MOSFETs Q1-Q4 are turned off and stop switching because no switching pulses are generated, thereby reducing the power consumption and improving the amplifier efficiency. Background noises are also reduced by the power-saving mode because the class-D amplifier ceases operation.

The switching control circuit is turned off only after the input signal is lower than the audible level for a predetermined time period because audio signals often swing across the zero point. If the switching control circuit is turned off every time a zero appears in the input audio signal, there will be distortion in the output signal.

The components of class-D amplifier 300 outside the power mode control circuit and the switching control circuit work in the same way as their counterparts of class-D amplifier 100.

As mentioned above, the power mode control circuit includes amplitude detector 320 and duration detector 332. Amplitude detector 320 provides amplitude signal SA to duration detector 332. Amplitude detector 320 is a comparator and provides amplitude signal SA according to the comparison result of input signal Vin and reference voltage VREF1. Amplitude signal SA is at a high state (such as logic 1) when the absolute signal level of input signal Vin is greater than reference voltage VREF1 and is at a low state (such as logic 0) when the absolute signal level is smaller than reference voltage VREF1. Reference voltage VREF1 is the audible level mentioned above, and is 50 mV in this embodiment.

Duration detector 332 provides shut-down signal SSD to the switching control circuit of class-D amplifier 300. Shut-down signal SSD is at the high state to turn off the switching control circuit when amplitude signal SA is at the low state for more than the predetermined time period, otherwise shut-down signal SSD is at the low state to turn on the switching control circuit.

Duration detector 332 includes controlled ramp circuit 330 and shut-down circuit 328. Controlled ramp circuit 330 comprises a current source 324 coupled between voltage source VCC and shut-down circuit 328, a capacitor 326 coupled between shut-down circuit 328 and ground GND, and a switch 322 coupled in parallel with capacitor 326. In this embodiment, switch 322 is an N-channel MOSFET (NMOSFET). Therefore switch 322 is turned on when amplitude signal SA is at the high state and is turned off when amplitude signal SA is at the low state.

Shut-down circuit 328 is a comparator providing shut-down signal SSD according to the comparison result of reference voltage VREF2 and the output of controlled ramp circuit 330. Reference voltage VREF2 (3.0V in this embodiment) is between the voltage levels of ground GND (0V in this embodiment) and voltage source VCC (5.0V in this embodiment). Shut-down circuit 328 outputs shut-down signal SSD at the high state when the output of controlled ramp circuit 330 is between reference voltage VREF2 and the voltage level of voltage source VCC. On the other hand, shut-down circuit 328 outputs shut-down signal SSD at the low state when the output of controlled ramp circuit 330 is between reference voltage VREF2 and the voltage level of ground GND.

Figure 4:
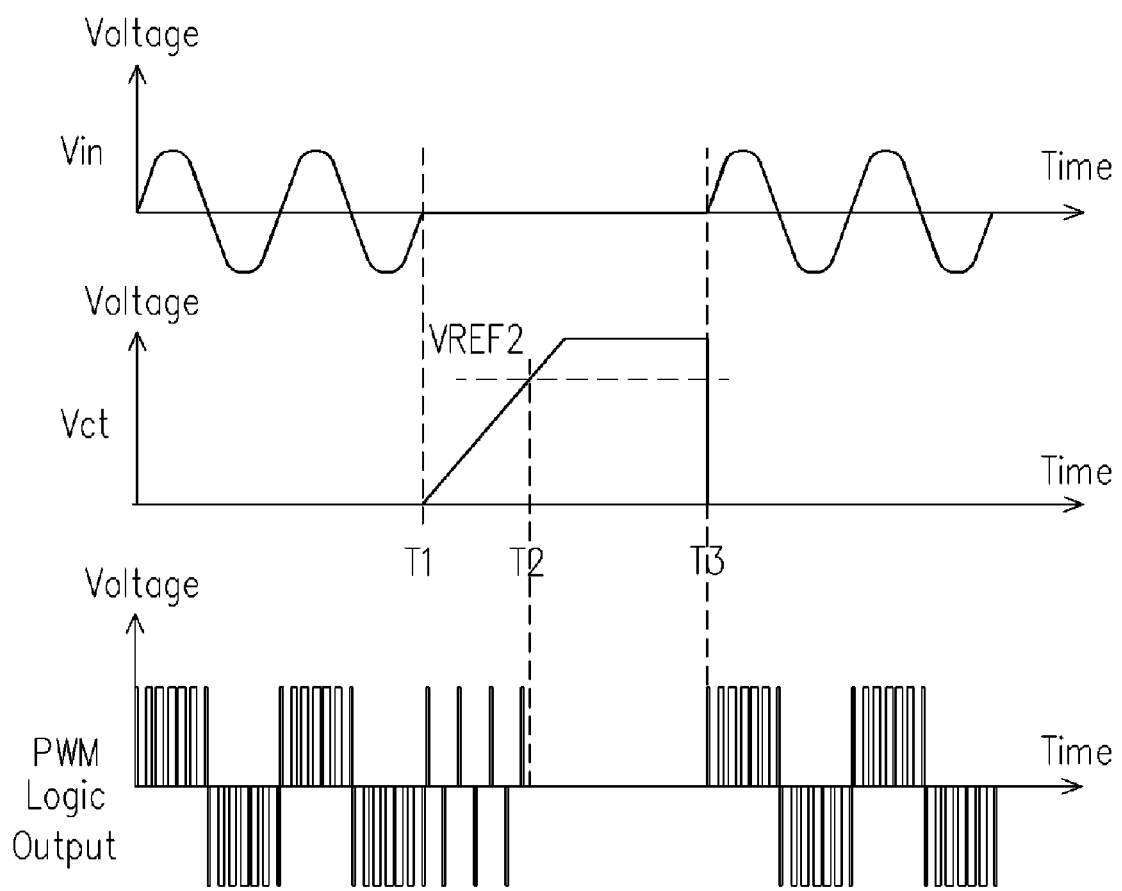
FIG. 4 is a schematic diagram showing the signal waveforms of the class-D amplifier in FIG. 3 and their timing sequence.

For the transition between the operating mode and the power-saving mode, please refer to FIG. 3 and FIG. 4. FIG. 4 is a schematic diagram showing the signal waveforms of class-D amplifier 300 and their timing sequence. Vin is the input signal. Vct is the voltage across capacitor 326. PWM logic output is the output signal provided by PWM logic 308.

Before moment T1, class-D amplifier 300 works in the operating mode. Input signal Vin is higher than reference voltage VREF1. Amplitude signal SA is at the high state, turning on switch 322 and shunting current source 324 to ground GND. Capacitor 326 cannot charge without current input. Therefore voltage Vct across capacitor 326 is about 0V and controlled ramp circuit 330 outputs the voltage level of ground GND. Shut-down signal SSD is at the low state and the switching control circuit remains turned-on.

At moment T1, input signal Vin drops below reference voltage VREF1. Amplitude signal SA enters the low state, turning off switch 322. Current Ich from current source 324 begins charging capacitor 326. Therefore controlled ramp circuit 330 outputs a ramp signal transitioning from the voltage level of ground GND to the voltage level of voltage source VCC. Controlled ramp circuit 330 is designed so that it takes about the predetermined time period for voltage Vct across capacitor 326 to charge from about 0V to about second reference voltage VREF2. At Moment T2, voltage Vct surpasses reference voltage VREF2. Shut-down signal SSD enters the high state, turning off ramp generator 318 and PWM logic 308, thereby turning off the switching control circuit. Class-D amplifier 300 enters the power-saving mode.

At moment T3, the absolute signal level of input signal Vin resumes to be higher than reference voltage VREF1. Amplitude signal SA returns to the high state, turning on switch 322. Voltage Vct across capacitor 326 is quickly discharged to 0V. Shut-down signal SSD returns to the low state and turns on the switching control circuit. Class-D amplifier 300 returns to the operating mode.

The design of duration detector 332 ensures that the switching control circuit is turned off only after the low level of input signal Vin lasts for the predetermined time period. In other words, the switching control circuit is not turned off merely because of transient zero levels, but because of actual silent periods. The design of duration detector 332 also ensures that the switching control circuit is turned on quickly when input signal Vin returns to the high level. Therefore loudspeaker 314 can receives the amplified audio signal without loss.

The present invention is not limited to the embodiment shown above. For example, persons skilled in the art can modify the design of controlled ramp circuit 330 in FIG. 3 so that a P-channel MOSFET (PMOSFET) can be used instead of an NMOSFET. In some other embodiments of the present invention, duration detector 332 can be replaced with a digital timer, which outputs shut-down signal SSD at the low state to turn on the switching control circuit when input signal Vin is higher than reference voltage VREF1 and pulls shut-down signal SSD to the high state to turn off the switching control circuit when input signal Vin is lower than reference voltage VREF1 for the predetermined time period. The improvement proposed by the present invention can be applied to any kind of class-D amplifiers. Persons skilled in the art can easily modify the switching control circuit of a class-D amplifier to have the switching control circuit turned on or turned off in response to the shut-down signal.

In addition to the power mode control circuit in the previous embodiment, the present invention also comprehends a method for controlling the power mode of a class-D amplifier. Since the method is already implemented by the power mode control circuit in the previous embodiment, further discussions are unnecessary.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power mode control circuit for a class-D amplifier, comprising:
    an amplitude detector for providing an amplitude signal according to the absolute signal level of an input signal, wherein the amplitude signal is at a high state when the absolute signal level of the input signal is greater than a first reference voltage and is at a low state when the absolute signal level is smaller than the first reference voltage; and
    a duration detector for providing a shut-down signal to a switching control circuit of the class-D amplifier according to the length of the time period in which the amplitude signal is at the low state, wherein the shut-down signal is at the high state when the amplitude signal is at the low state for more than a predetermined time period, otherwise the shut-down signal is at the low state, and the switching control circuit is turned off when the shut-down signal is at the high state and is turned on when the shut-down signal is at the low state.

2. The power mode control circuit of claim 1, wherein the amplitude detector is a comparator providing the amplitude signal according to the comparison result of the input signal and the first reference voltage.

3. The power mode control circuit of claim 1, wherein the duration detector comprises:
    a controlled ramp circuit for outputting the voltage level of a ground when the amplitude signal is at the high state and outputting a ramp signal transitioning from the voltage level of the ground to the voltage level of a voltage source when the amplitude signal is at the low state; and
    a shut-down circuit for outputting the shut-down signal according to the output of the controlled ramp circuit.

4. The power mode control circuit of claim 3, wherein the controlled ramp circuit comprises:
    a current source coupled between the voltage source and the shut-down circuit;
    a capacitor coupled between the shut-down circuit and the ground; and
    a switch coupled in parallel with the capacitor, turned on or turned off in response to the amplitude signal.

5. The power mode control circuit of claim 4, wherein the switch is turned on when the amplitude signal is at the high state and is turned off when the amplitude signal is at die low state.

6. The power mode control circuit of claim 4, wherein the switch comprises a MOSFET.

7. The power mode control circuit of claim 4, wherein the shut-down circuit is a comparator providing the shut-down signal according to the comparison result of a second reference voltage and the output of the controlled ramp circuit.

8. The power mode control circuit of claim 7, wherein the second reference voltage is between the voltage levels of the ground and the voltage source.

9. The power mode control circuit of claim 8, wherein the shut-down circuit outputs the shut-down signal at the high state when the output of the controlled ramp circuit is between the second reference voltage and the voltage level of the voltage source, and the shut-down circuit outputs the shut-down signal at the low state when the output of the controlled ramp circuit is between the second reference voltage and the voltage level of the ground.

10. The power mode control circuit of claim 7, wherein, when the switch is turned off, it takes about the predetermined time period for the voltage across the capacitor to charge from about 0V to about the second reference voltage.

11. A power mode control method for a class-D amplifier, comprising:
    (a) providing an amplitude signal according to the absolute signal level of an input signal, wherein the amplitude signal is at a high state when the absolute signal level of the input signal is greater than a first reference voltage and is at a low state when the absolute signal level is smaller than the first reference voltage; and
    (b) providing a shut-down signal to the switching control circuit of the class-D amplifier according to the length of the time period in which the amplitude signal is at the low state, wherein the shut-down signal is at the high state when the amplitude signal is at the low state for more than a predetermined time period, otherwise the shut-down signal is at the low state, and the switching control circuit is turned off when the shut-down signal is at the high state and is turned on when the shut-down signal is at the low state.

12. The power mode control method of claim 11, wherein the amplitude signal is provided according to the comparison result of the input signal and the first reference voltage.

13. The power mode control method of claim 11, wherein step (b) comprises:
    (1) outputting the voltage level of a ground when the amplitude signal is at the high state and outputting a ramp signal transitioning from the voltage level of the ground to the voltage level of a voltage source when the amplitude signal is at the low state; and
    (2) outputting the shut-down signal according to the output of step (1).

14. The power mode control method of claim 13, wherein the shut-down signal is provided according to the comparison result of a second reference voltage and the output of step (1).

15. The power mode control method of claim 14, wherein the second reference voltage is between the voltage levels of the ground and the voltage source.

16. The power mode control method of claim 15, wherein step (2) comprises:

outputting the shut-down signal at the high state when the output of step (1) is between the second reference voltage and the voltage level of the voltage source; and outputting the shut-down signal at the low state when the output of step (1) is between the second reference voltage and the voltage level of the ground.

* * * * *